United States Patent
Mysore et al.

(10) Patent No.: US 6,308,303 B1
(45) Date of Patent: Oct. 23, 2001

(54) WIRE TAPERING UNDER RELIABILITY CONSTRAINTS

(75) Inventors: Sriram Mysore, San Jose; Wilsin Gosti, Freemont, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/299,302

(22) Filed: Apr. 26, 1999

(51) Int. Cl.⁷ .................................................. G06F 17/50
(52) U.S. Cl. ...................................... 716/5; 716/3
(58) Field of Search ........................ 716/5, 8; 395/500.09, 395/500.05, 500.06, 500.36

(56) References Cited

U.S. PATENT DOCUMENTS

| | | | |
|---|---|---|---|
| 5,410,490 | * | 4/1995 | Yastrow ................................. 364/488 |
| 5,737,580 | * | 4/1998 | Hathaway et al. .................... 395/500 |
| 5,841,333 | * | 11/1998 | Fishburn et al. ...................... 333/238 |
| 6,028,989 | * | 2/2000 | Dansky et al. .................. 395/500.09 |
| 6,117,182 | * | 9/2000 | Alpert et al. ............................. 716/8 |

OTHER PUBLICATIONS

Cong, J.J., et al., "Optimal Wiresizing Under Elmore Delay Model", *IEEE Transactions on Computer–Aided Design of Circuits and Systems*, 14, pp. 321–336, (Mar. 1995).

* cited by examiner

*Primary Examiner*—David Nelms
*Assistant Examiner*—Thong Le
(74) *Attorney, Agent, or Firm*—Schwegman, Lundberg, Woessner & Kluth, P.A.

(57) ABSTRACT

Methods and systems provide a tool to assist a designer in selecting interconnect widths which improve both signal time propagation and maintain a reliable conductor. Downstream capacitance(s) of interconnects is evaluated, and a current which the interconnect conducts is also evaluated. The capacitance and current information is used to determine a conductor width which maintains physical reliability. The methods and systems also allow the conductor widths to be determined based upon signal propagation concerns, such that in interconnect networks where signal timing is critical, the conductor widths can be reduced while maintaining a reliable conductor.

17 Claims, 4 Drawing Sheets

WIRE TAPERING UNDER RELIABILITY CONSTRAINTS

TECHNICAL FIELD OF THE INVENTION

The present invention relates generally to integrated circuit interconnects and in particular the present invention relates to determining interconnect widths.

BACKGROUND OF THE INVENTION

Integrated circuits are fabricated with a plurality of circuits distributed across a chip, or die. The distributed circuits are electrically connected using conductive interconnect networks. For simplicity, these conductive interconnects are referred to herein as wires. It will be understood, however, that the electrical interconnects are conductive or semiconductor material fabricated as traces having a length, width and thickness. The physical dimensions, layout and material composition dictate the electrical characteristics of the interconnect. That is, for a given material the physical dimensions dictate the resistance of the conductive trace, its electrical current capacity and its capacitance. Integrated circuit designers are faced with the challenge of minimizing signal delay experienced as a voltage signal propagates along the interconnect network. Computer aided tools and algorithms have been developed to assist in determining interconnect physical dimensions to improve time critical networks. For example, see J. Cong, K. S. Leung, Optimal Wiresizing Under Elmore Delay Model, IEEE Transactions on Computer-Aided Design of Circuits and Systems, March 1995, pp. 321–336, for a description of an algorithm which can be used to determine optimal wire widths using tapering techniques to improve timing characteristics.

Wire tapering is a design technique in which wires which are close to a driver circuit are made wider than wires which are close to receiver circuits. This reduces the capacitance of the signal path and increases the spacing between adjacent wires, effectively reducing interconnect delay, power consumption and cross talk in integrated circuits.

Electromigration and self-heating phenomena place constraints on the minimum allowed width of a wire, depending on the current flow through the wire. In academic and commercial tapering solutions, these phenomena are not accounted for. The solutions produced using these techniques result in wires which must be widened by manually editing the resultant design. If this manual editing is not performed, an integrated circuit may be fabricated which has reliability problems. That is, a fuse-type conductor will be created if a wire width is selected which is not sufficient to carry a required current. Over the life of the integrated circuit, therefore, the conductor may fail.

For the reasons stated above, and for other reasons stated below which will become apparent to those skilled in the art upon reading and understanding the present specification, there is a need in the art for a tool which allows circuit designers to determine optimal interconnect network configurations without compromising a reliability of the integrated circuit.

SUMMARY OF THE INVENTION

In one embodiment, a method is provided for determining interconnect wire widths in a wiring network. The method comprises calculating a minimum width of directed interconnects having a defined electrical current path. The minimum width is calculated based upon a determined downstream capacitance and an electrical current value. A first interconnect width is calculated for each undirected interconnect in the network having an ambiguous electrical current path direction. The first interconnect width is calculated by determining a first downstream capacitance in a first interconnect direction, determining a second downstream capacitance in a second interconnect direction which is opposite the first interconnect direction, and calculating a first interconnect width based upon the first and second downstream capacitances. After the first interconnect width is calculated for each undirected interconnect, additional widths for the undirected interconnects are calculated until a convergence is reached such that the additional widths remain constant.

In another embodiment, a method is provided for selecting interconnect wire widths in a wiring network. The method comprises determining a first width of an interconnect wire based upon electrical power requirements of the interconnect wire, and determining a second width of the interconnect wire based upon signal propagation timing requirements. A final width of the interconnect wire is selected such that the final width is either equal to the first width if the first width is greater than the second width, or equal to the second width if the second width is greater than the first width.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

As stated above, there is a need for a tool which allows integrated circuit designers to determine optimal interconnect network layouts to minimize signal delays and insure a reliable product. If all the effort is focused on determining a network which has a minimum timing delay, reliability of the interconnect network may be compromised. Different embodiments of the present invention are described herein which provide a tool for use by an integrated circuit designer to layout conductive interconnect networks without compromising integrity of the interconnects.

Figure 1A:
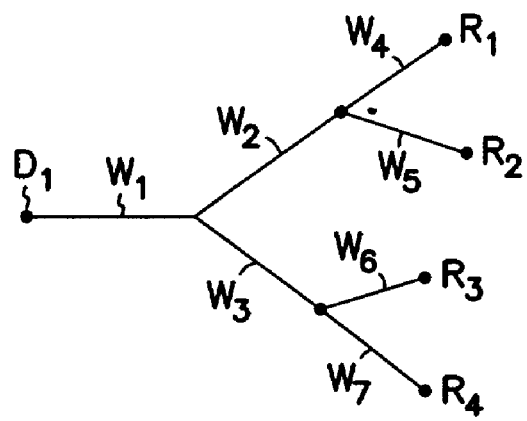
FIG. 1A illustrates a simplified interconnect network.

Referring to FIG. 1A, a simplified interconnect wiring network is illustrated. The network includes one driver circuit, D1, and four receiver circuits, R1–R4. The driver circuit is coupled to the receiver circuits through seven wires W1–W7, or interconnects. This interconnect network is simplified, but illustrates what is referred to herein as directed wires. That is, the direction in which a signal, or current, flows is known. In this illustration, signals will travel from the driver D1 to the receiver circuits. Because there are no additional driver circuits located throughout the interconnect network, the direction of current flow is unambiguous.

Figure 1B:
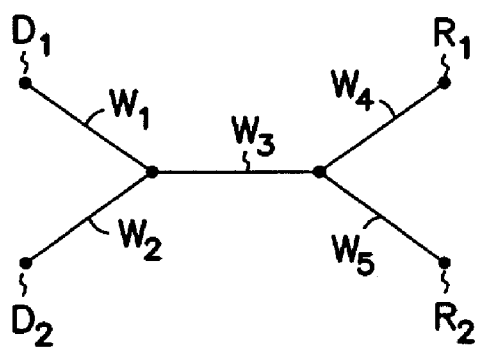
FIG. 1B illustrates another simplified interconnect network.

A simplified interconnect wiring network in which current flow in all interconnects is not known, is illustrated in FIG. 1B. The network includes two driver circuits, D1 and D2, which are connected to two receiver circuits, R1 and R2. Although it can be easily determined that the direction of current in wires W3, W4 and W5 is from left to right (driver to receiver), the direction of current in wires W1 and W2 is not known. These wires are referred to herein as undirected wires. The current flow in these wires will be dependent upon which driver circuits are active at a given time.

The present invention provides a wire tapering technique which minimizes delay while satisfying reliability requirements. The tapering technique employees an iterative bottom-up optimization methodology. In each iteration, the method begins with wires that are connected to the "leaves" of the interconnect tree. For each of these wires, the current can be computed accurately, and a lower bound for the width of the wire is established with a specified reliability constraint. A width is then found for the wire that satisfies the lower bound and locally minimizes delay. This methodology proceeds in a bottom-up manner, thus allowing the current in every wire to be computed accurately. To reduce delay, the bottom-up iteration is performed until the wire widths are not change between iterations. As such, the wire widths converge, resulting in the solution that minimizes delay while maintaining reliability of the interconnect wires.

This process often results in a tapered network where interconnects electrically located close to a driver circuit have a wider width than interconnects which are electrically located close to receiving circuits.

Figure 2:
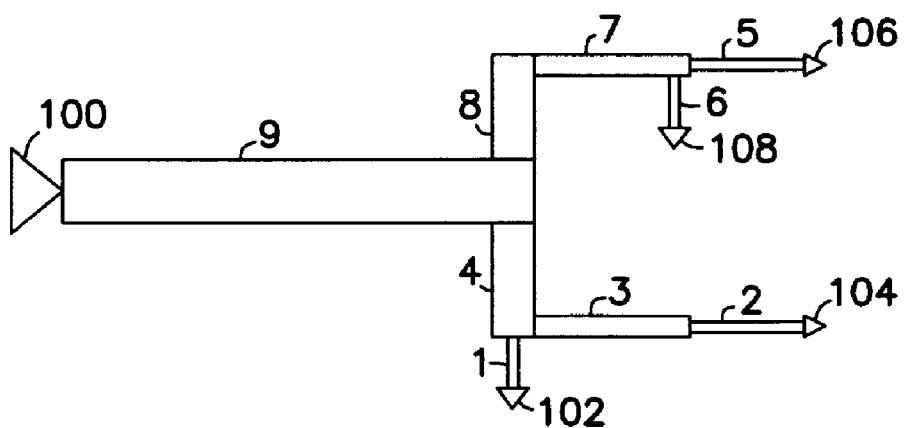
FIG. 2 illustrates a simple interconnect network incorporating a tapered interconnect network.

FIG. 2 illustrates a simplified wiring network which incorporates a tapered scheme. The wiring network includes one driver circuit 100 and four receiving circuits 102, 104, 106 and 108. It can be seen that the conductors coupled to the receiver circuits have a narrower width than the conductor coupled to the driver circuit. The direction of current in each conductor is known, and the order in which the wires are processed in a bottom-up analysis are illustrated. The wires which form the electrical branch to receiver circuits 102 and 104 are analyzed first to determine an appropriate width for each conductor segment which satisfies both timing and reliability requirements. The order of analysis is indicated by number 1–9, with 1 being the first wire analyzed. The wires which form the electrical branch to receiver circuits 106 and 108 are then analyzed to determine an appropriate width for each conductor. Finally, a width is determined for the conductor which couples the driver circuit to these conductive branches. Again, the wiring network in FIG. 2 comprises directed wires. If the network includes undirected wires, the order in which wires are analyzed may not be clear. That is, a bottom-up analysis for one driver circuit may actually be a top-down analysis for another driver circuit. To address this problem, an iterative analysis is performed as described in greater detail below.

Figure 3:
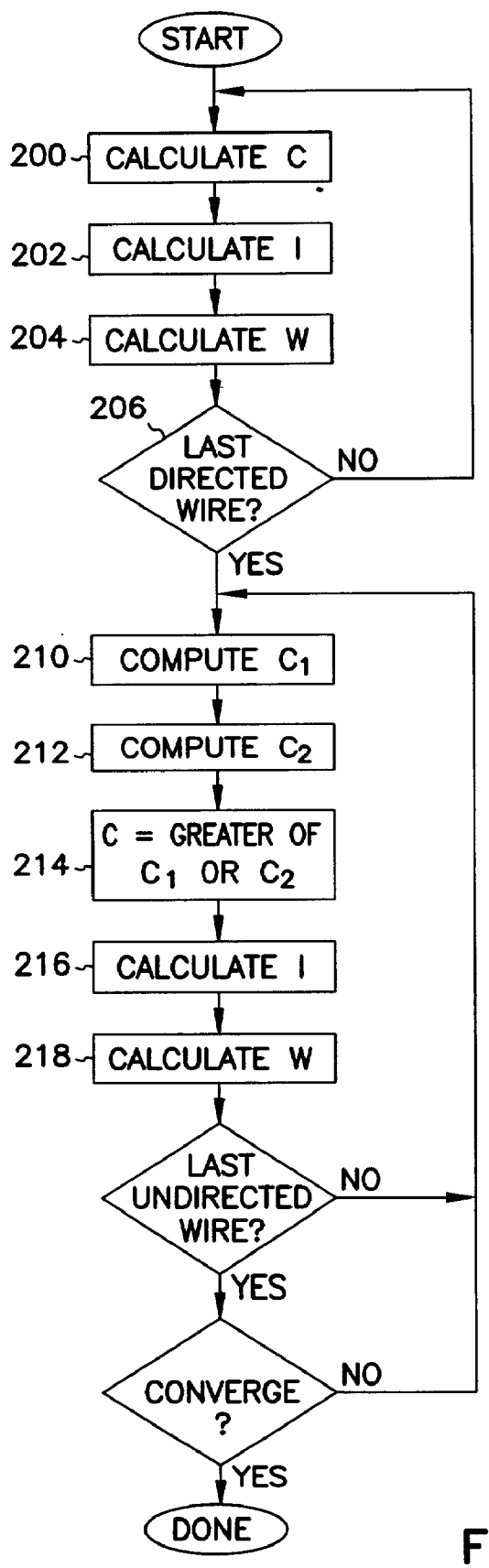
FIG. 3 is a flow chart illustrating one embodiment of the present invention.

A first methodology, or algorithm, is described which establishes minimum widths for conductors in a wiring network based upon reliability requirements. This algorithm does not directly address timing critical networks. Referring to FIG. 3, a simplified flow chart is provided to illustrate one embodiment of the present invention for determining interconnect network wiring widths. The analysis begins by determining a minimal width for each directed conductor. Starting at step 200 a down stream capacitance is calculated for the directed conductor. After the capacitance is calculated, a down stream current (rms) is calculated. Based on the calculated current requirement and the characteristics of the conductive material, a minimum width for the conductor is calculated to insure reliability. This process (steps 200 to 204) is repeated until the last directed wire has been analyzed. If the network only includes directed wires, the process has been completed and all interconnect wires have a minimum width which meets reliability requirements. That is, the conductors have a width sufficient to conduct its designated current without failing.

If the wiring network includes undirected wires, the algorithm is continued to determine minimum widths for these conductors. Because the down stream direction of undirected wires is unknown, two calculations must be performed. At step 210 a downstream capacitance is calculated in a first direction for an undirected wire. At step 212 a downstream capacitance is calculated in an opposite direction for the same wire. The highest capacitance determined in these two steps is used for the downstream capacitance to calculate current at step 216. Again, a minimum width is determined based upon the calculated current requirements of the interconnect wire at step 218. This process (steps 210 to 218) is repeated until the last undirected wire has been processed such that all undirected wires have a minimum width value. As stated above, analysis of the undirected wires must continue until the minimum width value for the undirected wires does not change between iterations. When the minimum width value for each undirected wire remains the same between iterations, the analysis is considered to have converged.

The methodology described with reference to FIG. 3 allows a designer to establish wiring network widths without compromising reliability. Detailed explanations of the manner in which the capacitance, current, and width values are determined are not provided herein, but are considered known to those skilled in the art.

A sample algorithm for execution by a computer system is provided as follows:

D=bottom-up order of directed wires
U=bottom-up order of undirected wires for each wire w in D do
   C=compute downstream capacitance
   I=compute downstream rms current
   width (w)=computed the minimum required width
end for
do
for each wire w in U do
   Cleft=compute downstream capacitance if signal flows left (in one direction)
   Cright=computed downstream capacitance if signal flows right (in the other direction)
if (Cleft>Cright) then
   C=Cleft else
    C=Cright
endif
I=compute downstream rms current with capacitance C
width(w)=compute the minimum required width end for
while (at least one of wire in U has a different width)

Pseudocode 1

The above pseudocode 1 is merely one example of possible computer instructions which instruct a computer to perform the desired functions of calculating minimum width values for interconnect wires.

The above described method provides a tool for determining interconnect wire widths which allow the wiring network to meet reliability considerations. This methodology can be combined with an analysis which selects interconnect widths to increase processing speeds.

Figure 4:
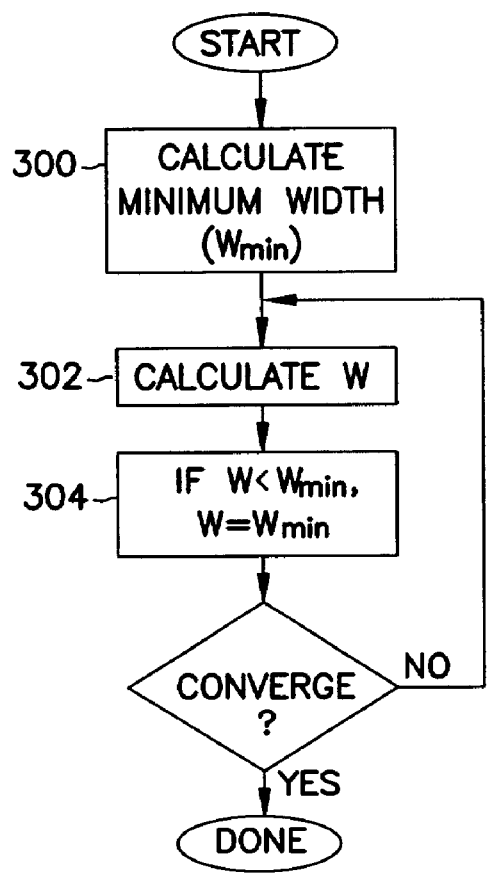
FIG. 4 is a flow chart illustrating another embodiment of the present invention.

Referring to FIG. 4, a flow chart is illustrated which calculates an interconnect width based upon both timing and reliability concerns. Starting at step 300, the minimum width, Wmin, of the conductor is determined to meet reliability concerns. The minimum width can be determined by using the algorithm described above with reference to FIG. 3, or the minimum width can be established based upon known design and layout criteria. At step 302, an optimum width W is calculated to maximize timing requirements. If the optimum width is less than the minimal width (W<Wmin), the optimum width is set equal to the minimal width value (W=Wmin). Steps 300 to 304 are repeated for each wire until a convergence is reached. That is, the optimum width for each wire is established, and then the process is repeated until the optimum width for each wire does not change during an iteration. The manner in which the optimum width is established at step 302 is not described in detail herein, but is known to those skilled in the art. For example, one technique is described in J. Cong, K. S. Leung, Optimal Wiresizing Under Elmore Delay Model, IEEE Transactions on Computer-Aided Design of Circuits and Systems, March 1995, pp. 321–336.

An example algorithm which can be used to instruct a computer to perform the above described method is as follows:
W=bottom up order of the wires of the network being tapered
Initialize all wires in W to be of minimum width.
do
    for each w in W do
        width (w)=optimum width of w while holding the widths of other wires constant
        if width (w)<minimum width of w then
            width (w)=minimum width of w
        end if
    end for
while (at least one wire in W has a different width)

Pseudocode 2 pseudocode 2 is merely one example of an instruction set which can be executed by a computer to calculate widths of interconnect network wires to meet both timing and reliability requirements. Other instructions and algorithms can be provided without departing from the present invention which allow different computers to perform the same methodology described.

The above described method can also be modified to calculate optimum widths of undirected interconnects. This methodology performs the same iterative process described above. The process of determining the minimum width for reliability, however, requires more computing as explained above in FIG. 3. An example of one method for multi-driver networks is outlined as follows. While the iterations converge in practice, a theoretical proof of the algorithm's convergence has not yet been established.
D=bottom up order of directed wires.
U=bottom up order of undirected wires.
for each wire w in D do
    C=compute downstream capacitance
    I=compute downstream rms current
    width(w)=optimum width of w with widths of other wires held constant
    if (width(w)<minimum width of w(w, I)) then
        width(w)=minimum width of w(w, I)
    end if
end for
do
    for each wire w in U do
        Cleft=compute downstream capacitance if signal flows left
        Cright=compute downstream capacitance if signal flows right
        if (Cleft>Cright) then
            C=Cleft
        else
            C=Cright
        endif
        I=compute downstream rms current with capacitance C
        width(w)=optimum width of w with widths of other wires held constant
        if (width(w)<minimum width of w(w, I)) then
            width(w)=minimum width of w (w, I)
        end if
    end for
while (at least 1 wire in U has a different width)

Pseudocode 3

Figure 5A:
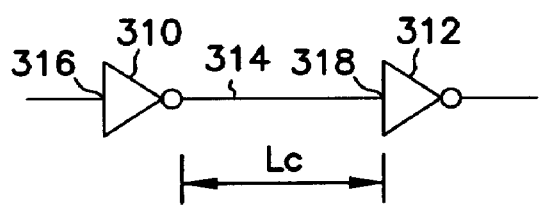
FIG. 5A illustrates a simple inverter circuit.
Figure 5B:
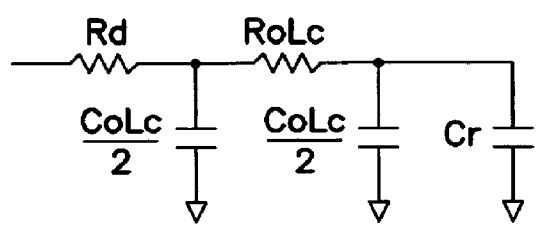
FIG. 5B illustrates a model of the simple circuit of FIG. 5A.

A segment of wire can be modeled as an RC circuit, where the wire segment has a resistance and capacitance per unit length of $r_o$ and $c_o$, respectively. Referring to FIGS. 5A and 5B, an example circuit includes two inverters 310 and 312 coupled with a wire 314 having length $l_c$. The time delay, t, from the input 316 of the first inverter 310 to the input 318 of the second inverter 312 is equal to the internal resistance ($R_d$) of the first inverter times the capacitance of the wire ($C_o$) and second inverter input pin ($C_r$), plus the wire resistance ($r_o$) times one-half the wire capacitance and the second inverter input pin capacitance. The following equation expresses this as:

$$t = R_d * (c_o * l_c + C_r) + r_o * l_c * \left(\frac{c_o * l_c}{2} + C_r\right)$$

The wire capacitance is expressed as two capacitances located at both ends of the wire. This model is generally referred to as an Elmore delay model. Thus, reducing the wire capacitance and wire resistance can decrease the delay times.

While the above equation is useful for evaluating signal delay, the reliability of a wire also needs to be evaluated for some interconnect networks. Thus, a wire minimum width and the current conducted through the wire need to be computed. The root mean squared (rms) current in milliamps can be calculated as follows:

$$I_{rms} = C_{rms} * V * C * \sqrt{(2*F*K)/S_{min}}$$

where $C_{rms}$ is the rms coefficient specific to the interconnect technology used, V is the supply voltage (Vcc) in volts, C is the downstream wire capacitance in pF, F is the clock frequency in Ghz, K is a network activity factor, and $S_{min}$ is the minimum slope of the network in nanoseconds.

The minimum width of a wire based upon reliability factors can be expressed as follows:

$$w_{min} = h_f * I_{rms}$$

where $w_{min}$ is the minimum width, $h_f$ is a self heat coefficient in microns/mA of the conductor material, and $I_{rms}$ is a rms current driving a downstream capacitance.

Figure 6:
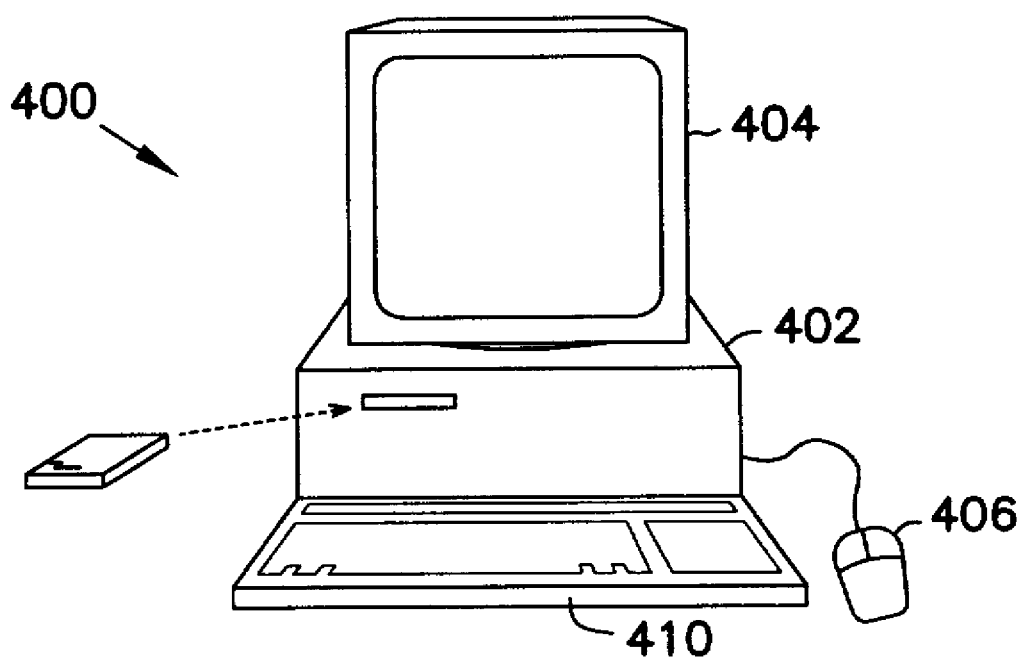
FIG. 6 shows a block diagram of a representative computer in conjunction with which embodiments of the invention may be practiced.

A representative computer, or processing system 400, in conjunction with which embodiments of the invention may be practiced is now described. Referring to FIG. 6, a diagram of such a computer is shown. Computer 402 is operatively coupled to monitor 404, optional pointing device 406, and keyboard 410. Computer 402 includes a processor, random-access memory (RAM) and/or read-only memory (ROM), and one or more storage devices, such as a hard disk drive, a floppy disk drive (into which a floppy disk can be inserted), an optical disk drive, and/or a tape cartridge drive. The memory, hard drives, floppy disks, etc., are different types of storage media. The invention is not particularly limited to any type of computer, or computing devices that comprise computers. The computer may be a PC-compatible computer, and the construction and operation of such computers are well known within the art. One embodiment of the present invention is a machine readable storage medium which includes instructions, or code, to instruct the processor to execute one or more of the methods described herein for determining interconnect conductor widths. The machine readable storage medium includes, but is not limited to, a magnetic storage medium, such as a diskette, an optically readable medium, such as a compact disc, and memory devices.

Methods and systems have been described which provide a tool to assist a designer in selecting interconnect widths which improve both signal time propagation and maintain a reliable conductor. The methods described evaluate both downstream capacitance(s) of the interconnects, and a current which the interconnect needs to conduct. This data is used to determine a conductor width which maintains physical reliability over the specified operating range (current and capacitance). Alternate embodiments also allow the conductor widths to be determined based upon signal propagation concerns. In interconnect networks where signal timing is critical, therefore, the conductor widths can be reduced while maintaining a reliable conductor.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of determining interconnect wire widths in a wiring network, the method comprising:

calculating a minimum width of directed interconnects having a defined electrical current path, the minimum width is calculated based upon a determined downstream capacitance and an electrical current value;

for each undirected interconnect in the network having an ambiguous electrical current path direction:

determining a first downstream capacitance in a first interconnect direction, determining a second downstream capacitance in a second interconnect direction which is opposite the first interconnect direction, and calculating a first interconnect width based upon the first and second downstream capacitances; and after the first interconnect width is calculated for each undirected interconnect, calculating additional widths for the undirected interconnects until a convergence is reached such that the additional widths remain constant.

2. The method of claim 1 wherein calculating the minimum width of directed interconnects is performed in a bottom-up order.

3. The method of claim 1 wherein calculating the first interconnect width for undirected interconnects is performed in a bottom-up order.

4. The method of claim 1 wherein the method is performed using a computer processing system.

5. A method of selecting interconnect wire widths in a wiring network, the method comprising:

determining a first width of an interconnect wire based upon electrical power requirements of the interconnect wire;

determining a second width of the interconnect wire based upon signal propagation timing requirements; and selecting a final width of the interconnect wire such that the final width is either equal to the first width if the first width is greater than the second width, or equal to the second width if the second width is greater than the first width.

6. The method of claim 5 wherein the electrical power requirements are established based upon a calculated downstream capacitance and a maximum electrical current conducted through the interconnect wire.

7. The method of claim 5 wherein the interconnect wire has a predefined current path direction.

8. The method of claim 5 wherein the interconnect wire has an undefined current path direction, such that an electrical current can flow in either direction along the interconnect wire depending upon more than one signal driving circuit.

9. The method of claim 8 wherein the electrical power requirements of the interconnect wire are established based upon two calculated downstream capacitances and a maximum electrical current conducted through the interconnect wire.

10. The method of claim 5 wherein the first width is determined by a method comprising:

calculating a width of directed-interconnects having a defined electrical current path, the width is calculated based upon a determined downstream capacitance and an electrical current value;

for each undirected interconnect in the network having an ambiguous electrical current path direction:

determining a first downstream capacitance in a first interconnect direction, determining a second downstream capacitance in a second interconnect direction which is opposite the first interconnect direction, and calculating a first interconnect width based upon the first and second downstream capacitances; and after the first interconnect width is calculated for each undirected interconnect, calculating additional widths for the undirected interconnects until a convergence is reached such that the additional widths remain constant.

11. The method of claim 5 wherein the first width is determined by a predetermined reliability width based upon an interconnect wire material.

12. A method of determining interconnect wire widths in a wiring network, the method comprising:

determining a first width of an interconnect wire based upon electrical power requirements of the interconnect wire, wherein the electrical power requirements are established based upon at least one calculated downstream capacitance and a maximum electrical current conducted through the interconnect wire;

determining a second width of the interconnect wire based upon signal propagation timing requirements; and selecting a final width of the interconnect wire such that the final width is either equal to the first width if the first width is greater than the second width, or equal to the second width if the second width is greater than the first width.

13. A method of determining interconnect wire widths in a wiring network, the method comprising:

for each undirected interconnect in the network which has a defined electrical current path:
calculate a downstream capacitance for the undirected interconnect, calculating maximum electrical current value which is conducted through the undirected interconnect, and calculating a width of directed interconnects, the width is calculated based upon the downstream capacitance and the maximum electrical current value;

for each undirected interconnect in the network having an ambiguous electrical current path direction:
determining a first downstream capacitance in a first interconnect direction, determining a second downstream capacitance in a second interconnect direction which is opposite the first interconnect direction, and calculating a first interconnect width based upon a greater of the first and second downstream capacitances; and after the first interconnect width is calculated for each undirected interconnect, calculating additional widths for the undirected interconnects until a convergence is reached such that the additional widths remain constant.

14. A machine readable storage medium which includes instructions to instruct a processor to determine interconnect wire widths in a wiring network, the method comprising:

calculating a width of directed interconnects having a defined electrical current path, the width is calculated based upon a determined downstream capacitance and an electrical current value;

for each undirected interconnect in the network having an ambiguous electrical current path direction:
determining a first downstream capacitance in a first interconnect direction, determining a second downstream capacitance in a second interconnect direction which is opposite the first interconnect direction, and calculating a first interconnect-width based upon the first and second downstream capacitances; and after the first interconnect width is calculated for each undirected interconnect, calculating additional widths for the undirected interconnects until a convergence is reached such that the additional widths remain constant.

15. A machine readable storage medium which includes instructions to instruct a processor to select interconnect wire widths in a wiring network, the method comprising:

determining a first width of an interconnect wire based upon electrical power requirements of the interconnect wire;

determining a second width of the interconnect wire based upon signal propagation timing requirements; and selecting a final width of the interconnect wire such that the final width is either equal to the first width if the first width is greater than the second width, or equal to the second width if the second width is greater than the first width.

16. A machine readable storage medium which includes instructions to instruct a computer to determine interconnect wire widths in a wiring network according to the method comprising:

determining a first width of an interconnect wire based upon electrical power requirements of the interconnect wire, wherein the electrical power requirements are established based upon at least one calculated downstream capacitance and a maximum electrical current conducted through the interconnect wire;

determining a second width of the interconnect wire based upon signal propagation timing requirements; and selecting a final width of the interconnect wire such that the final width is either equal to the first width if the first width is greater than the second width, or equal to the second width if the second width is greater than the first width.

17. A processing system comprising:

a processor for determining a first width of an interconnect wire based upon electrical power requirements of the interconnect wire, wherein the electrical power requirements are established based upon at least one calculated downstream capacitance and a maximum electrical current conducted through the interconnect wire, the processor determines a second width of the interconnect wire based upon signal propagation timing requirements, the processor selects a final width of the interconnect wire such that the final width is either equal to the first width if the first width is greater than the second width, or equal to the second width if the second width is greater than the first width; and a memory coupled to the processor for storing the final width of the interconnect wire.

* * * * *